US006735140B1

(12) United States Patent
Fiscus et al.

(10) Patent No.: US 6,735,140 B1
(45) Date of Patent: May 11, 2004

(54) METHOD AND SYSTEM FOR PERFORMING MEMORY OPERATIONS OF A MEMORY DEVICE

(75) Inventors: Tim Fiscus, South Burlington, VT (US); Dave Chapman, Shelburne, VT (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/326,176

(22) Filed: Dec. 19, 2002

(51) Int. Cl.$^7$ .............................................. G11C 7/00
(52) U.S. Cl. ...................................... 365/222; 365/203
(58) Field of Search .............................. 355/222, 203

(56) References Cited

U.S. PATENT DOCUMENTS 6,324,113 B1 * 11/2001 Tomita ........................ 365/222
6,438,055 B1 * 8/2002 Taguchi et al. ............. 365/222
6,625,079 B2 * 9/2003 Yahata et al. ............... 365/222

* cited by examiner

Primary Examiner—Trong Phan
(74) Attorney, Agent, or Firm—Wagner, Murabito & Hao LLP (57) ABSTRACT

A method of performing memory operations of a memory device having precharge, read and write states is disclosed. The method includes refreshing the memory device provided a refresh timer expired and the memory device is in the precharge state. The method further includes entering the precharge state, refreshing the memory device and returning to the read state provided the memory device is in the read state for a predetermined period of time. The memory device is refreshed provided the memory device is transitioning from the read state to the write state and the refresh timer has expired.

20 Claims, 8 Drawing Sheets

METHOD AND SYSTEM FOR PERFORMING MEMORY OPERATIONS OF A MEMORY DEVICE

TECHNICAL FIELD

Embodiments of the present invention relate generally to memory systems. In particular, an embodiment of the present invention relates to a method for performing memory operations of a memory device.

BACKGROUND ART

Some memory systems require periodic refreshing to maintain the voltage levels that are stored in their memory cells. A refresh operation may be a word line activation that restores the voltage level of the data stored in a memory cell. Some high density SRAMs (e.g., static random access memory) are characterized by memory cell structures that require DRAM (dynamic random access memory) type refreshes even though standard SRAM timing interfaces are employed in their construction. This requirement necessitates the hiding of these DRAM type operations (e.g., making them transparent to a user) within standard SRAM timing configurations.

Many conventional methodologies for hiding DRAM type operations within standard SRAM timing configurations employ pulsed read and write cycles and feature the inhibition of refresh operations during the active portions of these cycles. Many applications of such methodologies are characterized by the toggling of memory addresses. These applications feature the activation of word lines whenever such memory addresses are toggled. A drawback of such methodologies is that when sub-minimum cycles are encountered, and the addresses are toggled very closely together, a continuous activating and deactivating of word lines at maximum frequencies may result. Consequently, because refresh operations may be inhibited during the activation of a word line (e.g., the active cycle), it may be difficult for a refresh operation to be executed in cases where such sub-minimum cycles are encountered.

Another drawback of conventional methodologies is the cycle time limitations that result from the need to accommodate the occurrence of late write operations. It should be appreciated that the pulsed word line activations that are employed in the execution of periodic refresh operations may expose such cycle time limitations. For example, if a refresh timer expires during the time interval between the initiation of read and write enable commands, a pulsed refresh operation may be executed before the execution of the enabled write operation. Consequently, it may be necessary to accommodate three memory cycles (e.g., read, refresh and write) within a single cycle time window of the overall system cycle. As a result, the speed of the memory device may be degraded by the constraint on cycle time imposed by the need to accommodate the three operations.

Figure 1:
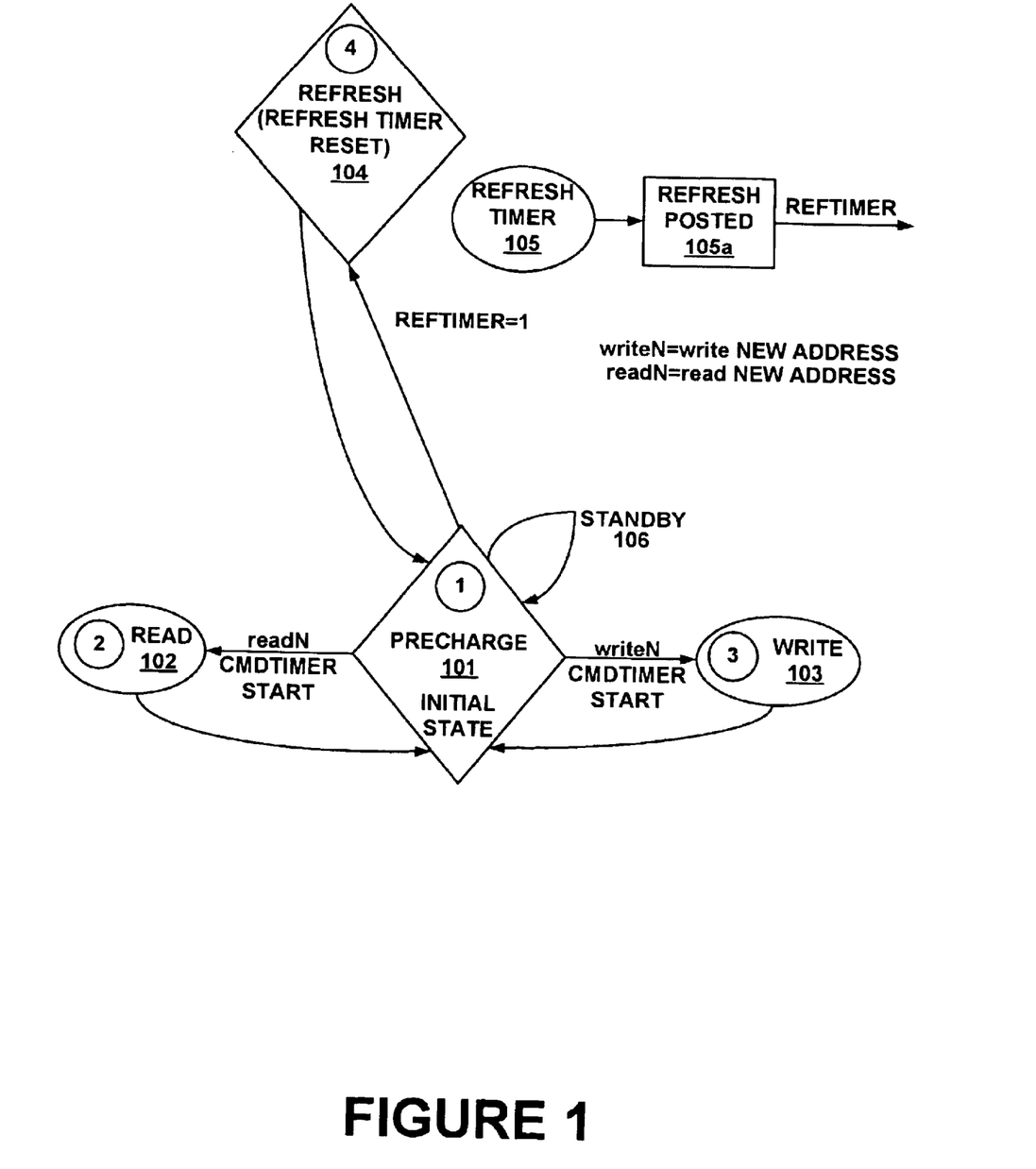
FIG. 1 shows a flow diagram of illustrating how refresh operations are hidden by a conventional system.

FIG. 1 is a state diagram 100 with states 1–4 which illustrate a process for hiding refresh operations according to a conventional scheme. FIG. 1 shows blocks representing logic states 1–4 that correspond to precharge 101, refresh 104, read 102 (new address), write (new address) 103, and standby 106 operations. Also shown in FIG. 1 is refresh timer 105 and a block 105a representing the posting of the refresh operation (e.g., refresh posted 105a).

Referring to FIG. 1, when either a read or a write command is received and the memory device corresponding to state diagram 100 is in precharge state 1 (e.g., 101), the memory device may perform a read operation 102 or a write operation 103 (depending on the command received) and then return to precharge state 1 where precharge operations 101 may be resumed. However, as is shown in FIG. 1, if the refresh timer 105 expires the memory device may perform a refresh operation 104 (e.g., state 4) and thereafter return to precharge state 1 (e.g., 101).

Figure 2:
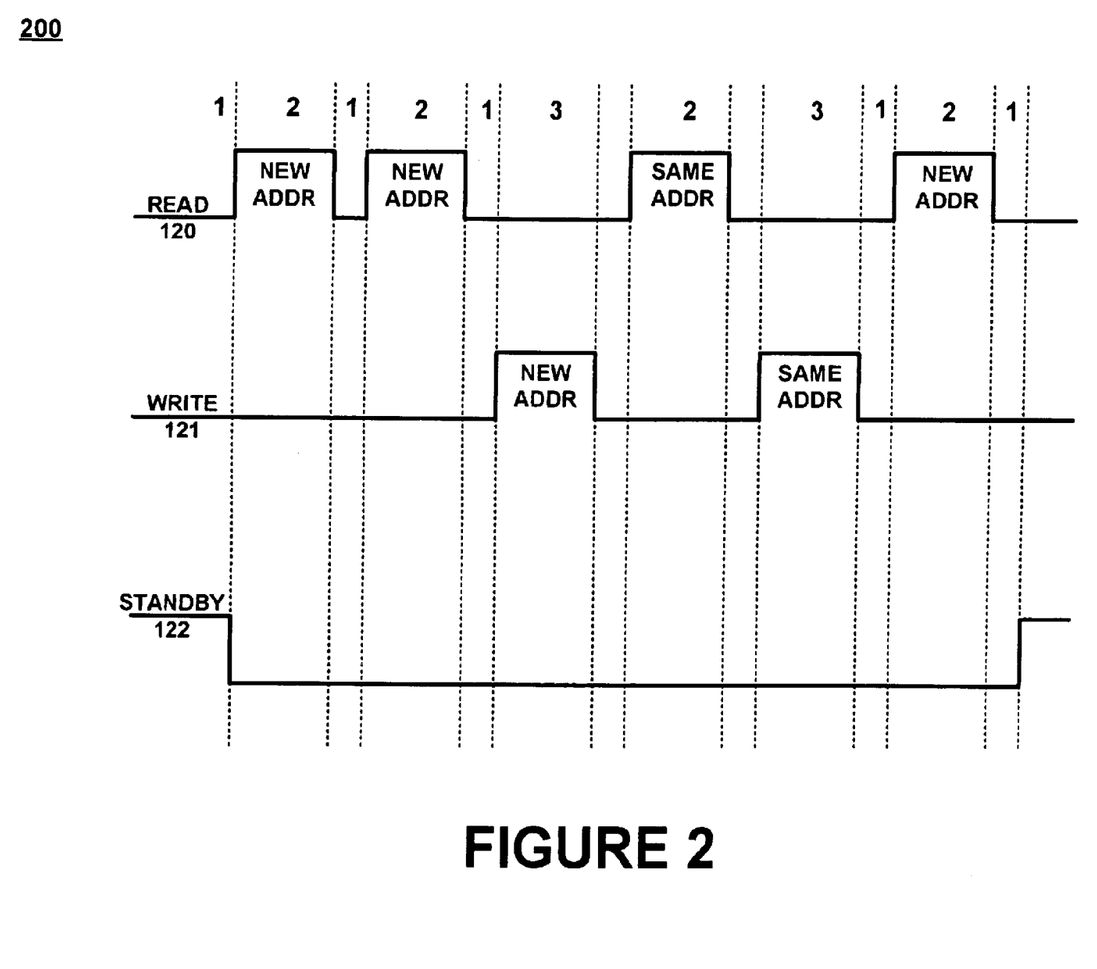
FIG. 2 shows a timing diagram that describes the various read and write cycles corresponding to the flow diagram of FIG. 1.

FIG. 2 shows a timing diagram 200 that illustrates characteristics of the various read and write operations (e.g., 102 and 103) employed by the memory device (not shown) corresponding to state diagram 100 of FIG. 1. It should be appreciated that many conventional systems continually inhibit refresh operations during the active cycles (e.g., during the performance) of read 102 and write 103 operations, which may prevent the execution of and the posting (e.g., 105a) of refresh operations 104. FIG. 2 shows read operation timing diagram 120, write operation timing diagram 121 and standby mode timing diagram 122.

Referring to FIG. 2, read operation timing diagram 120 and write operation timing diagram 121 show that when either a read or a write command is received and the memory device is in precharge state 1 (e.g., 101), the memory device may perform a read operation 102 (e.g., state 2) or a write operation 103 (e.g., state 3) (either to a new address or to the same address) and may then return to precharge state 1 where precharge operations 101 may be resumed. Standby timing diagram 122 shows that these operations may be performed when the device has exited the standby mode 106 (e.g., low power mode). The timing diagrams depicted represent a typical functioning of read 102 and write 103 operations in a conventional memory device.

Figure 3:
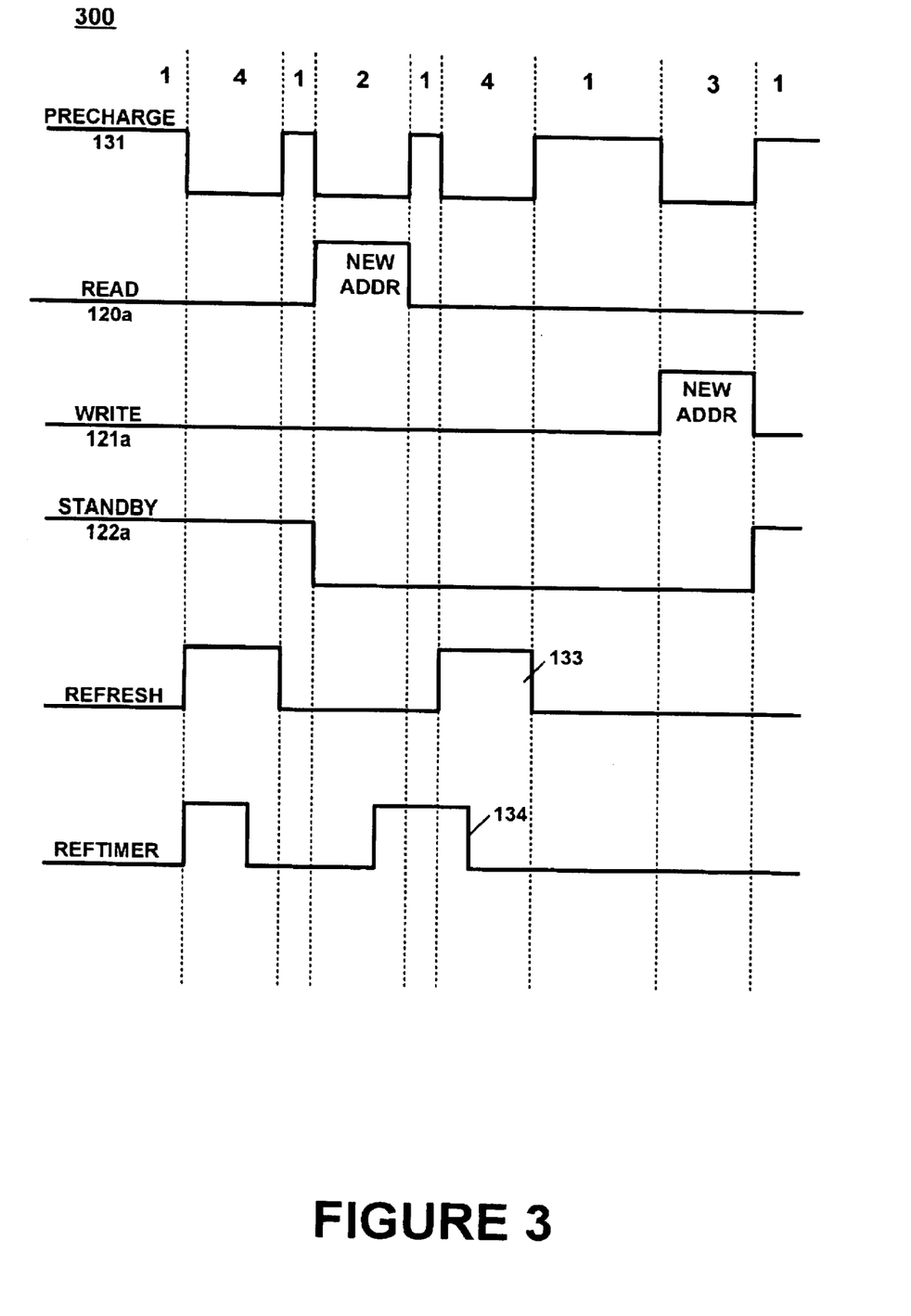
FIG. 3 describes the functioning of the refresh operation of the memory system whose operation is described by FIGS. 1 and 2.

FIG. 3 shows a timing diagram that illustrates characteristics of the refresh operations (e.g., 104) employed by a memory device corresponding to state diagram 100 of FIG. 1. FIG. 3 shows precharge operation timing diagram 131, read operation timing diagram 120a, write operation timing diagram 121a, standby mode timing diagram 122a, refresh operation timing diagram 133 and refresh timer diagram 134.

Referring to FIG. 3, timing diagrams 300 show that when the refresh timer 105 expires during a read operation 102, the refresh operation 104 may be inhibited until the read operation 102 is completed as is shown by timing diagrams 120a, 133 and 134 (e.g., corresponding respectively to the read 102, refresh 104 and refresh timer 105 operations). Upon the termination of the read operation, if another command has not yet occurred, an ensuing refresh operation 104 may be performed as is again shown by timing diagrams 120a, 133 and 134. It should be appreciated that precharge timing diagram 131, write operation timing diagram 121a, and standby mode timing diagram 122a (e.g., corresponding respectively to precharge 101, write 103, and standby 106 operations) illustrate the functioning of their corresponding memory operations in the context of the conventional refresh hiding scheme employed by a memory device corresponding to state diagram 100 of FIG. 1.

Figure 4:
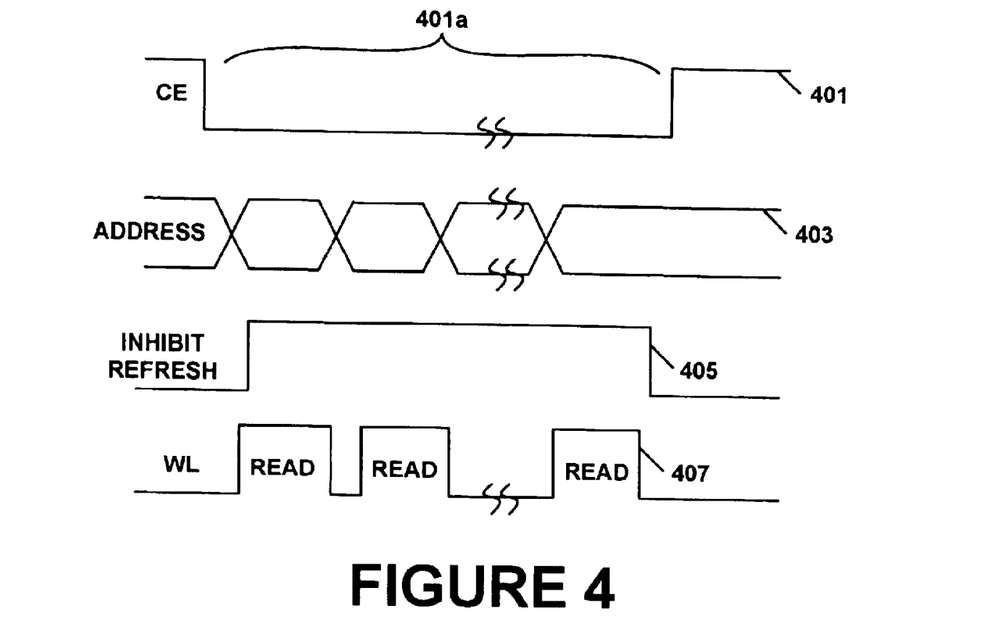
FIG. 4 shows a timing diagram that illustrates the sub minimum cycle problem where refresh operations are prohibited during read and write cycles.

FIG. 4 shows a timing diagram that illustrates the sub minimum cycle response of a conventional memory device such as described above with reference to FIGS. 1–3. Because the conventional refresh hiding methodologies described by FIGS. 1–3 may block refresh operations 104 during read and write cycles (e.g., during read operations and write operations 102 and 103), a refresh operation 104 may be inhibited (e.g., as by inhibit refresh 405) during this entire period if a memory device is operated at sub-minimum access (e.g., one example is address toggling 403)

as is illustrated in FIG. 4. It should be appreciated that when addresses are toggled very closely together such as is shown in FIG. 4 (see timing diagram 403), the continuous activating and closing of word lines at maximum frequencies may result. As is shown in FIG. 4, this may correspond to memory device behavior such as the execution of successive read operations 102 (e.g., 407) in a manner that blocks the enablement of refresh operations thereby making it difficult for a refresh operation 104 to be executed. All of the aforementioned memory operations may be enabled during the cycle time window 401a shown in chip enable timing diagram 401.

Figure 5:
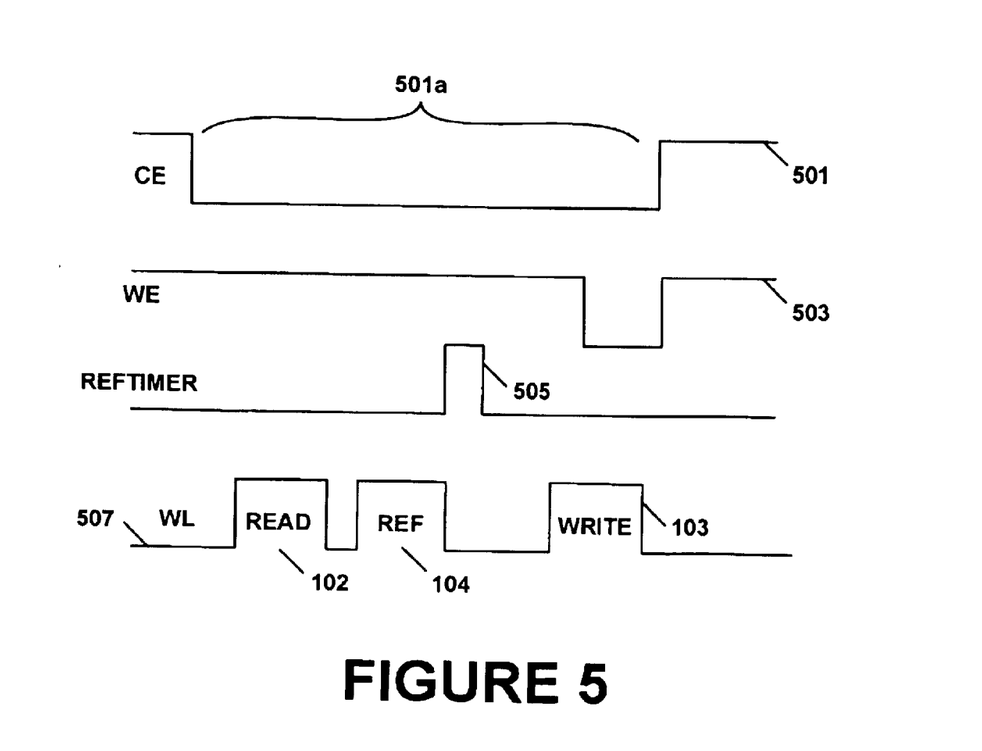
FIG. 5 shows a timing diagram that illustrates cycle time limitation problems that in the case of late writes require a read, refresh, and write cycle to occur within one cycle.

FIG. 5 shows a timing diagram that illustrates cycle time constraints (e.g., limitations) that in the case of late writes require a read, refresh, and write operations to occur within a single cycle time window of an overall system cycle. It should be appreciated that as suggested the cycle time of a memory device may be limited in some conventional systems by the occurrence of a late write operation 103 such as is shown in FIG. 5 (see word line timing diagram 507). FIG. 5 shows that where a late write (e.g., 103 enabled by a signal represented by write enable timing diagram 503) is encountered such systems require the accommodation of a read (e.g. 102), refresh (e.g., 104, see refresh timer timing diagram 505), and a write operation (e.g., 103) during a single cycle time window 501a of the overall system cycle (see chip enable timing diagram 501). Such constraints impose severe cycle time limitations on the memory device and negatively impact the memory devices performance.

Referring to FIG. 5, when a read operation 102 terminates during the chip enable period (illustrated by chip enable timing diagram 501), and the refresh timer 105 shortly thereafter expires (see refresh timer timing diagram 505), the occurrence of a write operation 103 (prompted by a write enable command such as described by write enable timing diagram 503) at a point late in this period forces the accommodation of three successive operations (see three successive word line activations illustrated by word line timing diagram 507) during a single overall system cycle (illustrated by chip enable timing diagram 501). As a result, the speed of the memory device may be degraded by the constraint on system cycle time imposed by the need to accommodate the three operations.

SUMMARY OF THE INVENTION

Accordingly, a need exists for a method and system that avoids cycle time and sub minimum cycle problems. The present invention provides a method and system which accomplishes the above mentioned need.

For instance, one embodiment of the present invention provides a method and system for performing memory operations of a memory device having precharge, read and write states. The method includes refreshing the memory device provided a refresh timer has expired and the memory device is in the precharge state. The method further includes entering the precharge state, refreshing the memory device and returning to the read state provided the memory device is in the read state for a predetermined period of time. The memory device is refreshed provided the memory device is transitioning from the read state to the write state and the refresh timer has expired.

The embodiments of the present invention provide a memory device having precharge, read and write states. The memory device includes a plurality of memory cells, and a logic state machine for controlling memory operations. The logic state machine performs the following operations: refreshes the plurality of memory cells provided a refresh timer has expired and the memory device is in the precharge state, enters the precharge state, refreshes the plurality of memory cells and returns to the read state provided the memory device is in the read state and a command timer has expired, and refreshes the plurality of memory cells provided the memory device is transitioning from the write state to the read state and the refresh timer has expired.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Notation and Nomenclature

Some portions of the detailed descriptions which follow are presented in terms of procedures, logic blocks, processing, and other symbolic representations of operations on data bits within a computer system or electronic computing device. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic signals capable of being stored, transferred, combined, compared, and otherwise manipulated in a computer system or similar electronic computing device.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, discussions utilizing terms such as "refreshing" or "transitioning" or the like, refer to the action and processes of a computer system, or similar electronic computing device, that manipulates and transforms data. For example, the data is represented as physical (electronic) quantities within the computer system's registers and memories and is transformed into other data similarly represented as physical quantities within the computer system memories or registers or other such information storage devices.

Method and System for Performing Memory Operations of a Memory Device

Figure 6:
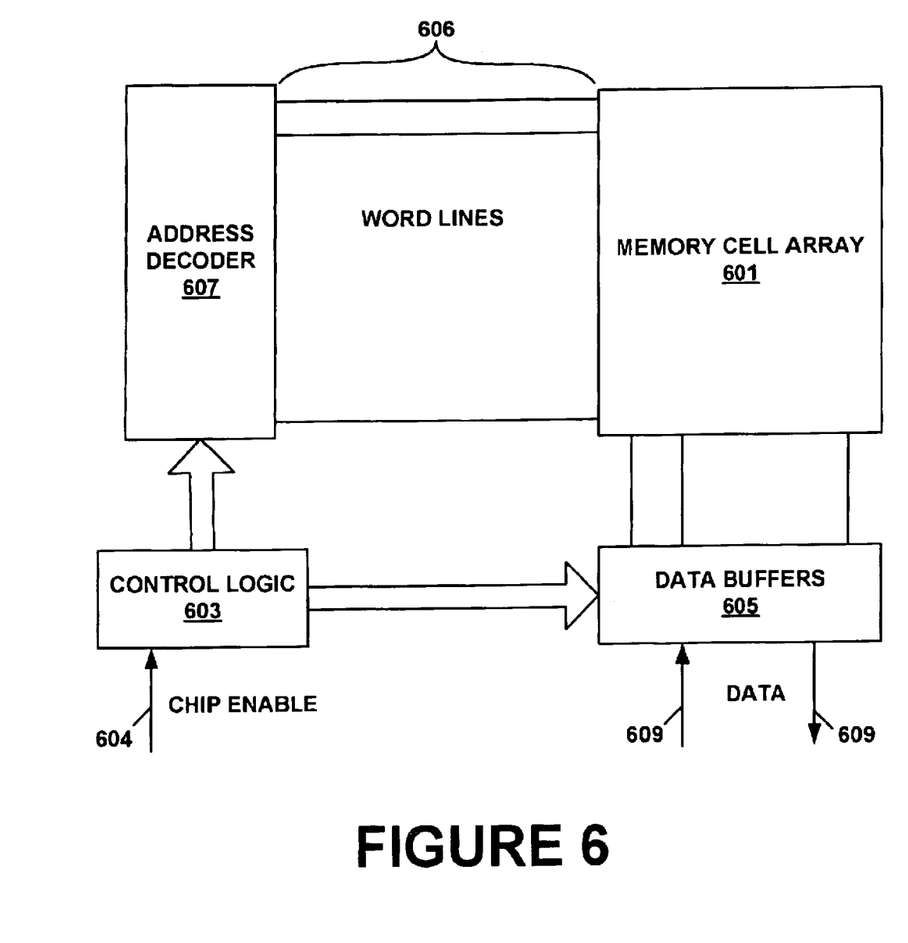
FIG. 6 is a simplified diagram of a core memory device according to one embodiment of the present invention.

FIG. 6 is a simplified diagram of a memory device 600 according to one embodiment of the present invention. According to one embodiment, memory device 600 may be a static random access memory (SRAM) device that employs dynamic random access memory (DRAM) type refreshes. It should be appreciated that, according to one embodiment of the present invention, the operation of the aforementioned refreshes may be blueprinted to function seamlessly (e.g., be hidden) within standard SRAM timing configurations. In addition, these operations may be performed in a manner that allows the cycle time and sub minimum cycle problems encountered in conventional systems to be avoided. FIG. 6 shows memory cell array 601, control logic (e.g., state machine) 603, chip enable 604, data buffers 605, word lines 606, address decoder 607 and data 609.

Memory cell array 601 contains an array (e.g., a plurality) of memory cells. According to one embodiment, these cells are configured to hold data 609 which may be maintained by processes controlled by control logic (e.g., state machine) 603. Data buffers 605 receive and buffer data 609 moving into and out of the memory device while address decoder 607 may address individual memory cells by means of word lines 606. It should be appreciated that according to one embodiment word lines 606 are not pulsed and may remain active while the chip enable 604 remains active.

Control logic 603 controls aspects of the functionality of such components as the refresh and command timers (described below with reference to FIG. 7A), and the performance of such operations as read, write, refresh and precharge according to one embodiment of the present invention. According to one embodiment control logic may include but is not limited to a state machine. According to exemplary embodiments, the control of the aforementioned components and operations is managed in a manner that allows cycle time and sub minimum cycle problems to be avoided.

According to embodiments of the present invention, by configuring control logic 603 to require that a refresh operation be initiated and performed prior to performance of a write operation (in the case where a late write operation is initiated during the performance of a read operation and the command timer has already been fired) cycle time problems may be avoided. If the late write is initiated before the command timer has been fired, control logic 603 directs an immediate transitioning from the read state to the write state. Consequently, at most only two operation cycles (either refresh/write or read/write) need be accommodated during a cycle time window of the overall system cycle. Therefore, the need to accommodate the execution of three consecutive operation cycles (read, write and refresh) during such time may be avoided. Additionally, the corresponding cycle time limitations that may result from the need to make this accommodation may be avoided.

It is important to note that according to embodiments of the present invention system cycles (read, write etc.) may be ended by the firing of a command timer. Therefore, as a conceptual matter, an old cycle time window is closed and a new one opened in the case where a late write operation is initiated during the execution of a read operation and the command timer has been fired causing the read cycle to end. According to one embodiment the ensuing refresh and write operations that are performed are executed outside of the old cycle time window. According to exemplary embodiments, a newly opened cycle time window thus need only accommodate at most two operation cycles. In addition, because the need to accommodate three operation cycles may be avoided, cycle time may be reduced and device performance improved according to exemplary embodiments of the present invention.

Figure 7A:
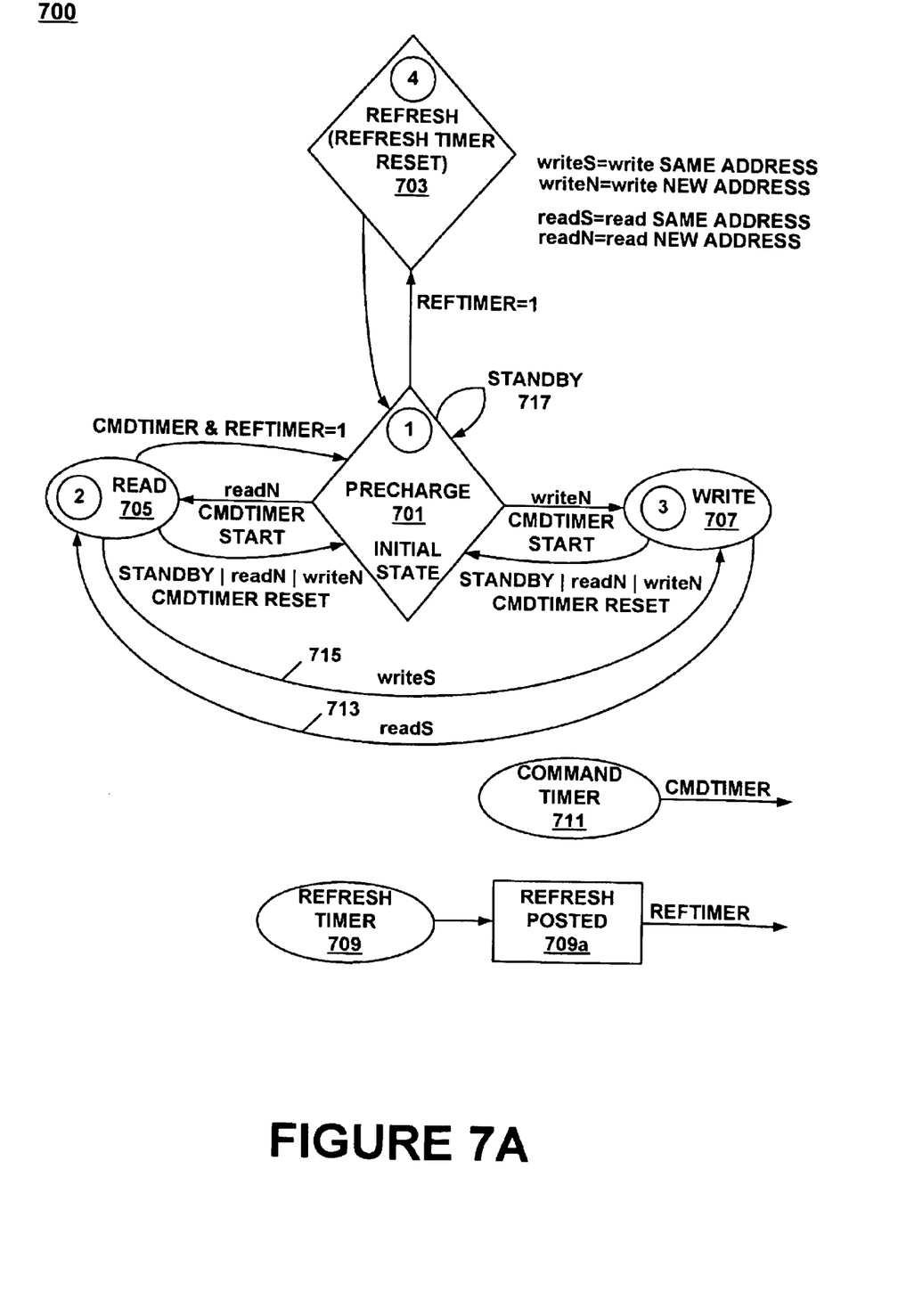
FIG. 7A shows a state diagram illustrating operations in a method for hiding a refresh according to one embodiment of the present invention.

FIG. 7A shows a state diagram 700A illustrating steps performed in a method for hiding a refresh operation according to one embodiment of the present invention. FIG. 7 shows blocks representing logic states 1–4 that correspond to precharge 701, refresh 703, read (new address) 705, write (new address) 707, read (same address) 713, write (same address) 715 and standby 717 operations. Also shown in FIG. 7A is refresh timer 709 and command timer 711, and a block 709a representing the posting of the refresh operation (e.g., refresh posted 709a).

According to embodiments of the present invention, when memory device 600 is in precharge state 1 (e.g., 701) and experiencing a standby mode 717, precharge operations 701 may be continued. However, if the refresh timer 709 expires control may move to state 4 where a refresh operation 703 may be performed. Subsequently, the refresh timer 709 may be reset and control may return to precharge state 1 (e.g. 701).

According to embodiments of the present invention, when memory device 600 is in precharge state 1 (e.g. 701) and a read cycle is initiated control may move to state 2 (e.g. 705) where a read operation 705 may be executed. Control may remain in state 2 (e.g. 705) until the read cycle ends or until the occurrence of an event that causes the transitioning of control to another state. Events which may cause a transitioning of control away from state 2 may include the initiation of a write (same address) operation 715, the expiring of the refresh timer 709 and the command timer 711, or the initiation of a standby 717, read (new address) 705 or write (new address) 707 operation wherein the command timer 711 is reset. It should be appreciated that in the case where a long read operation (e.g. 705) is being experienced (e.g., control is in read state 2 for a predetermined period of time) and the refresh timer 709 and the command timer 711 fires before the read operation 705 is completed (indicating that a refresh operation 703 is necessary) control transitions to state 1 (e.g., 701) and then to state 4 (e.g., 703) where a refresh operation 703 may be performed. Once the refresh operation 703 is posted (e.g., refresh posted 709a) control may transition back to state 1 (e.g., 701). It should be appreciated that because the read cycle had not completed, control may subsequently be transitioned back to state 2, with the command 711 and refresh timers 709 being reset in the process. Additionally, according to exemplary embodiments, the aforementioned predetermined period of time may be substantially longer than a cycle time window of said memory device.

According to one embodiment, when memory device 600 is in precharge state 1 (e.g. 701) and a write cycle is initiated control may move to state 3 (e.g. 707) where a write operation 707 may be performed. Control may remain in state 3 (e.g. 707) until the write cycle ends or until the occurrence of an event which causes the transitioning of control to another state. Events which may cause a transitioning of control away from state 3 (e.g. 707) may include the initiation of a read (same address) operation 713, or the initiation of standby 717, read (new address) 705 or write (new address) 707 operations wherein the resetting of the command timer 711 may be directed. In the case where a read (same address) 713 operation is initiated, control transitions from state 3 (e.g., write operation 707) to state 2 directly where control remains until the occurrence of an event that causes transitioning of control away from state 2.

It should be appreciated that according to exemplary embodiments, refresh operations 703 may not be commenced during a write operation (e.g., 707, 713). Therefore, a maximum write cycle period may be predetermined. According to one embodiment this period may be based on the retention capacity of the memory cell. According to one embodiment, the write operation period may be predetermined to be less than the maximum period that is allowable between refresh operations 703.

According to exemplary embodiments, a feature of the operations discussed above is that cycle time problems may be avoided. By configuring control logic 603 to require that a refresh operation 703 be initiated and performed prior to performance of a write operation 707 cycle time problems may be avoided in the case where a late write operation is initiated during the performance of a read operation 705 (and command timer 711 has already been fired). If the late write operation 707 is initiated before command timer 711 has been fired, control logic 603 directs an immediate transitioning from read state 2 (e.g., 705) to write state 3 (e.g., 707). Consequently, in either case, at most only two operation cycles (either refresh/write or read/write) need be accommodated during a cycle time window of the overall system cycle. Therefore, the need to accommodate the execution of three consecutive memory operation cycles (e.g., read, write and refresh) during such time may be avoided. Additionally, the corresponding cycle time limitations resulting from the need to make this accommodation may be avoided.

According to exemplary embodiments, another feature of the operations discussed above with reference to 7A is that sub minimum cycle problems may be avoided. Referring to FIG. 7A, if successive read operations 705 are initiated, and an intervening expiring of the refresh timer 709 occurs, control is transitioned from state 2 (e.g., read operation 705) to state 1 (e.g., precharge operation 701) to state 4 (e.g., refresh operation 703) and back to state 2 (e.g., read operation 705) via state 1 (e.g., precharge operation 701). In this way even if successive read operations 705 are encountered an intervening refresh operation 703 may be accommodated.

Figure 7B:
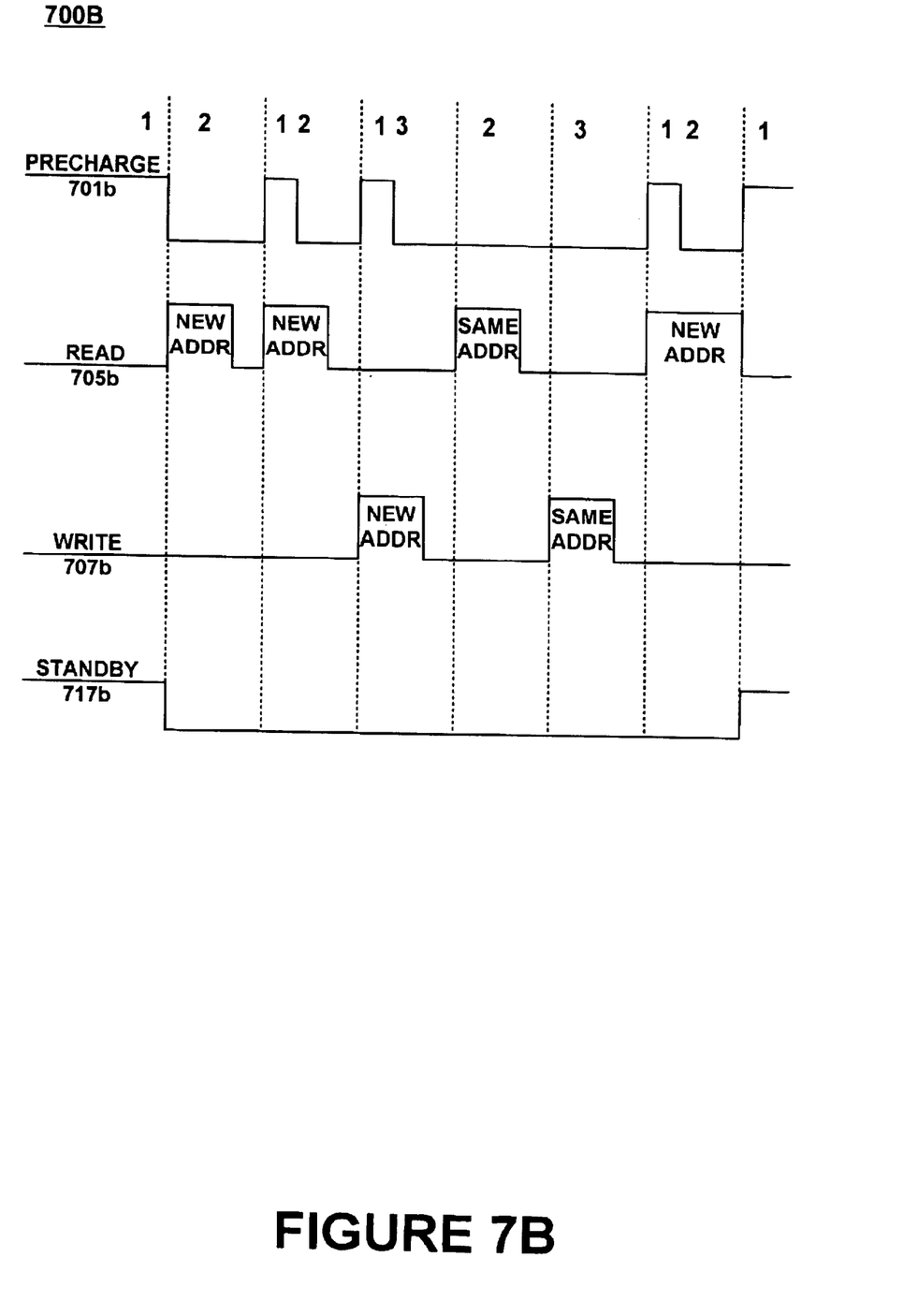
FIG. 7B shows a timing diagram that describes the various read and write cycles corresponding to the flow diagram of FIG. 7A.

FIG. 7B shows timing diagrams 700B that illustrate the functioning of the read and write operations depicted by the state diagram of FIG. 7A according to one embodiment of the present invention. FIG. 7B shows timing diagrams 701b, 705b, 707b, and 717b that correspond to the precharge 701, read 705, write 707 and standby 717 operations. Referring to FIG. 7B, transitioning from a first read operation 705 (e.g., state 2) to a new address to a subsequent read operation 705 (e.g., state 2) to a new address may be accomplished by first performing a precharge operation 701 (e.g., state 1) before transitioning to the subsequent read operation 705 (as is shown by timing diagrams 701b and 705b). By contrast, transitioning from a read operation 705 (e.g., state 2) to a write (e.g., state 3) operation 707 (or vice versa) may be made directly without any intervening precharge operations 701 (e.g., state 4) when transitioning from a read operation 705 (e.g., state 2) to a write (e.g., state 3) operation (or vice versa) to the same address (as is shown by timing diagrams 701b, 705b and 707b). Standby timing diagram 717b illustrates the functioning of the standby operations 717 of a memory device corresponding to the state diagram 700 of FIG. 7A.

Figure 7C:
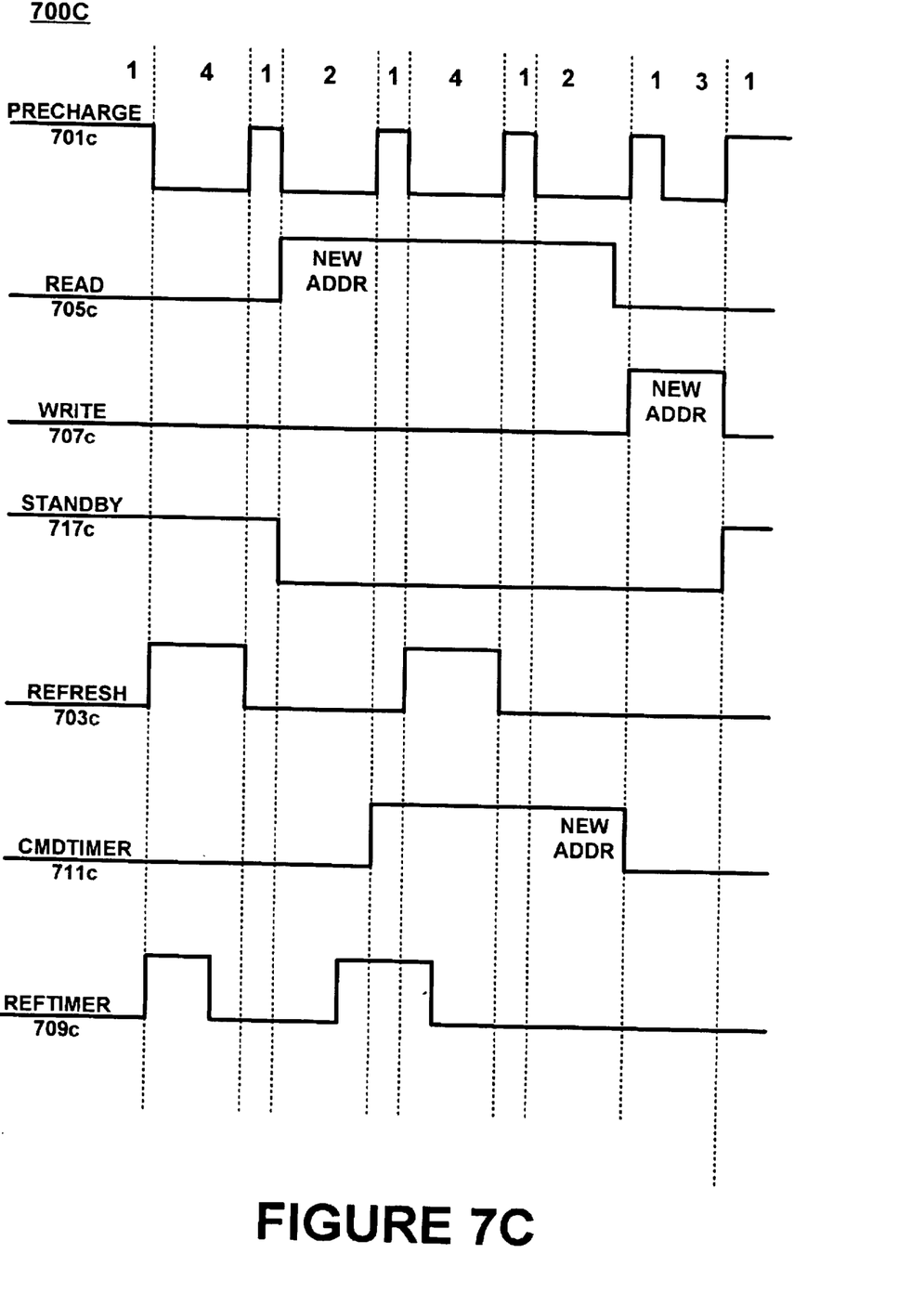
FIG. 7C shows examples of the functioning of refresh operations according to one embodiment of the present invention.

FIG. 7C shows timing diagrams that illustrate the functioning of the refresh operation 703 depicted in the state diagram of FIG. 7A according to one embodiment of the present invention. FIG. 7A shows timing diagrams 701c, 705c, 707c, 717c, 703c, 711c, and 709c that correspond to the precharge 701, read 705, write 707, standby 717 and refresh 703 operations, and the command 711 and refresh 709 timers.

As is shown in FIG. 7C, a refresh operation 703 (e.g., state 4) may be performed when the refresh timer 709 expires during a precharge operation 701 (e.g., state 1) according to one embodiment of the present invention (as is shown by timing diagrams 703c, 709c and 701c). If the refresh timer 709 and the command timer 711 expire during a read operation 705 (e.g., state 2) (including read operations whose durations are longer than normal), a precharge operation 701 (e.g., state 1) and a subsequent refresh operation 703 (e.g., state 4) may be performed as is illustrated in FIG. 7C (shown by timing diagrams 709a, 711a, 705a, 701a, and 703a). Standby timing diagram 717a illustrates the functioning of standby operations 717 in the context of the aforementioned pattern of memory operations.

As noted above with reference to exemplary embodiments thereof, the present invention provides a method and system for performing memory operations of a memory device that has precharge, read and write states. The method includes refreshing the memory device provided a refresh timer expired and the memory device is in the precharge state. The method further includes entering the precharge state, refreshing the memory device and returning to the read state provided the memory device is in the read state for a predetermined period of time. The memory device is refreshed provided the memory device is transitioning from the read state to the write state and the refresh timer has expired.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of performing memory operations of a memory device having precharge, read and write states, said method comprising:
    a) refreshing said memory device provided a refresh timer expired and said memory device is in said precharge state;
    b) entering said precharge state, refreshing said memory device and returning to said read state provided said memory device is in said read state for a predetermined period of time; and
    c) refreshing said memory device provided said memory device is transitioning from said read state to said write state and said refresh timer expired.

2. A method as described in claim 1 further comprising d) refreshing said memory device provided said memory device is transitioning from said write state to said read state and said refresh timer expired.

3. A method as described in claim 2 further comprising e) inhibiting any refreshing of said memory device provided said memory device is within said write state.

4. A method as described in claim 2 wherein said predetermined period of time is based on a command timer and further comprising resetting said command timer upon a new command being encountered by said memory device, wherein said predetermined period of time is substantially longer than a cycle time window of said memory device.

5. A method as described in claim 2 wherein a period of said refresh timer is based on a retention time of memory cells of said memory device.

6. A method as described in claim 2 wherein said memory device is a static random access memory (SRAM) device.

7. A method as described in claim 6 wherein said memory device comprises a chip enable and wordlines and wherein further said wordlines are not pulsed and remain active while said chip enable is active.

8. A method as described in claim 4 wherein a refresh operation performed at said refreshing is one of at most two operations performed during said cycle time window of said memory device.

9. A method of performing memory operations of a memory device having precharge, read and write states, said method comprising:
    a) refreshing said memory device provided a refresh timer expired and said memory device is in said precharge state;
    b) entering said precharge state, refreshing said memory device and returning to said read state provided said memory device is in said read state and a command timer expired; and
    c) refreshing said memory device provided said memory device is transitioning from said write state to said read state and said refresh timer expired.

10. A method as described in claim 9 further comprising d) refreshing said memory device provided said memory device is transitioning from said read state to said write state and said refresh timer expired.

11. A method as described in claim 10 further comprising e) inhibiting any refreshing of said memory device provided said memory device is within said write state.

12. A method as described in claim 10 further comprising resetting said command timer upon a new command being encountered by said memory device, wherein a period of said command timer is substantially longer than a cycle time window of said memory device.

13. A method as described in claim 10 wherein a period of said refresh timer is based on a retention time of memory cells of said memory device and wherein further said memory device is a static random access memory (SRAM) device.

14. A method as described in claim 13 wherein said memory device comprises a chip enable and wordlines and wherein further said wordlines are not pulsed and remain active while said chip enable is active.

15. A method as described in claim 12 wherein a refresh operation performed at said refreshing is one of at most two operations performed during said cycle time window of said memory device.

16. A memory device having precharge, read and write states and comprising:
    a plurality of memory cells; and
    a logic state machine for controlling memory operations, said logic state machine for performing the following:
        a) refreshing said plurality of memory cells provided a refresh timer expired and said memory device is in said precharge state;
        b) entering said precharge state, refreshing said plurality of memory cells and returning to said read state provided said memory device is in said read state and a command timer expired; and
        c) refreshing said plurality of memory cells provided said memory device is transitioning from said write state to said read state and said refresh timer expired.

17. A memory device as described in claim 16 wherein said logic state machine also performs refreshing said plurality of memory cells provided said memory device is transitioning from said read state to said write state and said refresh timer expired.

18. A memory device as described in claim 16 wherein said logic state machine also performs inhibiting any refreshing of said plurality of memory cells provided said memory device is within said write state.

19. A memory device as described in claim 18 wherein said command timer is reset upon a new command being encountered by said memory device and wherein further a period of said command timer is substantially longer than a cycle time window of said memory device.

20. A memory device as described in claim 16 wherein a period of said refresh timer is based on a retention time of said plurality of memory cells and wherein further said memory device is a static random access memory (SRAM) device and wherein further said memory device comprises a chip enable and wordlines and wherein further said wordlines are not pulsed and remain active while said chip enable is active.

* * * * *